United States Patent
Yoshizawa et al.

(10) Patent No.: US 7,103,709 B2
(45) Date of Patent: Sep. 5, 2006

(54) RETRIEVING DEVICE AND METHOD, RECORDING MEDIUM, AND PROGRAM FOR ENABLING A PLURALITY OF ASSOCIATIVE MEMORIES FOR RETRIEVAL AND AUTO-STORING

(75) Inventors: Hiroshi Yoshizawa, Chiba (JP); Masato Yoneda, Chiba (JP)

(73) Assignee: Sony Corporation, Tokyo (JP)

( * ) Notice: Subject to any disclaimer, the term of this patent is extended or adjusted under 35 U.S.C. 154(b) by 307 days.

(21) Appl. No.: 10/829,071

(22) Filed: Apr. 21, 2004

(65) Prior Publication Data
US 2004/0215871 A1    Oct. 28, 2004

(30) Foreign Application Priority Data
Apr. 22, 2003    (JP)    ............... P2003-116596

(51) Int. Cl.
*G06F 12/00* (2006.01)
*G06F 13/00* (2006.01)
(52) U.S. Cl. ................................. 711/108; 365/49
(58) Field of Classification Search ........... 711/108, 711/128; 365/49
See application file for complete search history.

(56) References Cited

U.S. PATENT DOCUMENTS

| | | | | |
|---|---|---|---|---|
| 6,070,223 A | * | 5/2000 | Yoshizawa et al. | 711/108 |
| 6,081,442 A | * | 6/2000 | Igarashi et al. | 365/49 |
| 6,336,113 B1 | * | 1/2002 | Yoneda | 707/6 |
| 6,493,793 B1 | * | 12/2002 | Pereira et al. | 711/108 |
| 6,567,286 B1 | * | 5/2003 | Yanagawa | 365/49 |
| 6,867,989 B1 | * | 3/2005 | Roy | 365/49 |

* cited by examiner

*Primary Examiner*—Hong Kim
(74) *Attorney, Agent, or Firm*—Frommer Lawrence & Haug LLP; William S. Frommer; Thomas F. Presson

(57) ABSTRACT

Each CAM of a retrieving device according to the present invention has one output terminal and four input terminals. One of the four input terminals is pulled down to input a logical value 0 at all times. The other three of the input terminals are connected to output terminals of other CAMs. Prior to starting auto-store processing, each CAM recognizes a terminal that inputs an output from a CAM having a higher priority than the CAM itself on the basis of an input signal [ABCD] including initial signals and the logical value 0 from the input terminals. On the basis of a result of the recognition, each CAM performs auto-store processing. Thereby auto-store processing can be readily performed by a plurality of CAMs.

4 Claims, 16 Drawing Sheets

FIG. 2

| ADDRESS | STORED DATA | EMPTY BIT | |
|---|---|---|---|
| ×××  | ×××  | 1 | ~21-1 |
| ×××  | ×××  | 0 | ~21-2 |
| ⋮ | ⋮ | | | m

F I G. 3
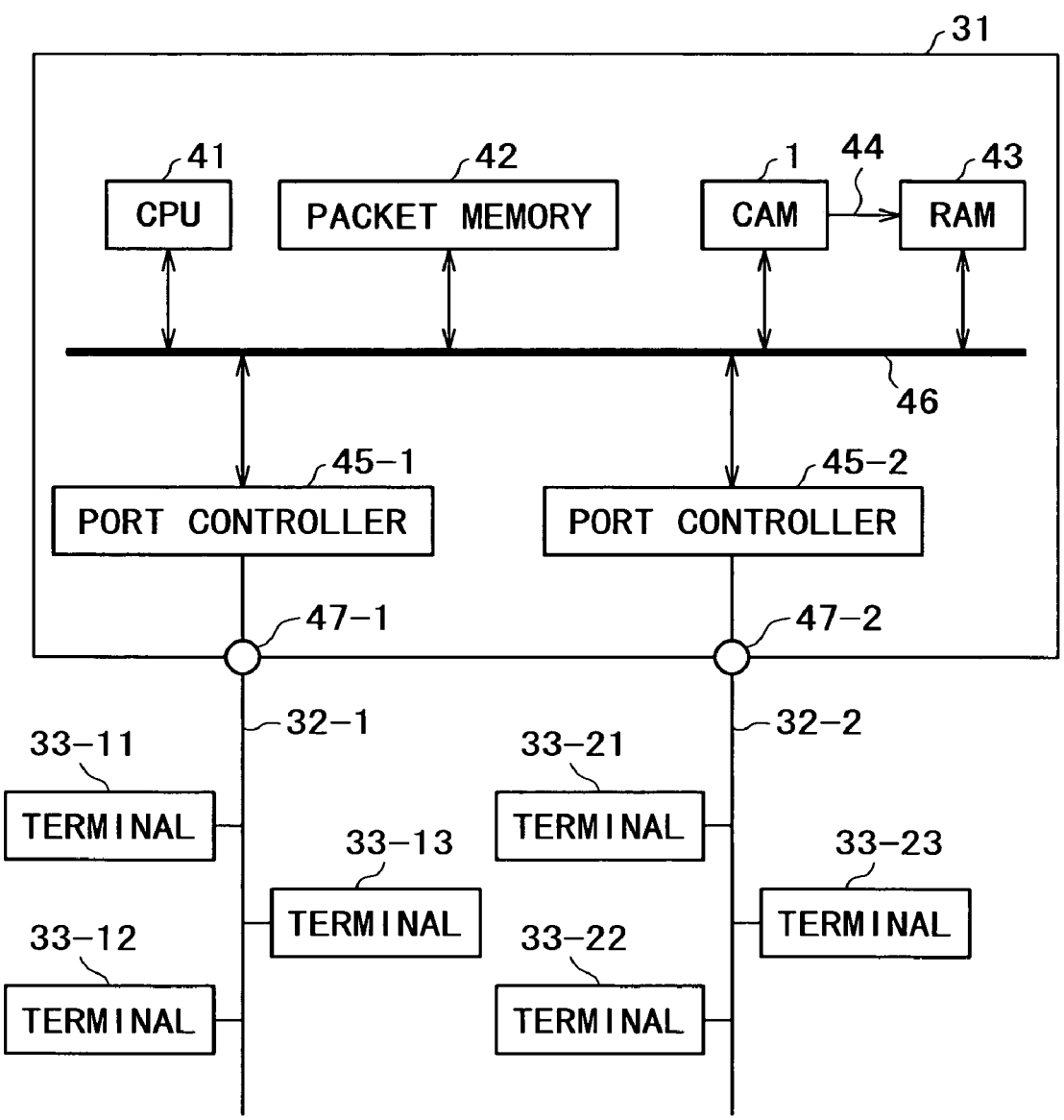

| ADDRESS | STORED DATA | | EMPTY BIT | |
|---|---|---|---|---|
| ×　×　× | NETWORK ADDRESS OF TERMINAL 33-11 | TIME STAMP | 1 | ~21-1 |
| ×　×　× | NETWORK ADDRESS OF TERMINAL 33-12 | TIME STAMP | 0 | ~21-2 |
| ⋮ | ⋮ | | | | m (spans ADDRESS, STORED DATA, EMPTY BIT)

FIG. 8

| ADDRESS | STORED DATA | EMPTY ADDRESS | |
|---|---|---|---|
| ××× | ××× | 1 | 1-1 |
| ⋮ | ⋮ | | |
| ADDRESS | STORED DATA | EMPTY ADDRESS | |
| ××× | ××× | 0 | 1-2 |
| ⋮ | ⋮ | | |
| ADDRESS | STORED DATA | EMPTY ADDRESS | |
| ××× | ××× | 1 | 1-3 |
| ⋮ | ⋮ | | |
| ADDRESS | STORED DATA | EMPTY ADDRESS | |
| ××× | ××× | 0 | 1-4 |
| ⋮ | ⋮ | | |

LOW → HIGH

| INPUT SIGNAL [ABCD] | PROCESSING |
|---|---|
| [1110] | INTERNAL HIT |
| [1101] | INPUT SIGNAL[D]!=0&&, INTERNAL HIT |
| [1011] | INPUT SIGNAL[C]!=0&&, INPUT SIGNAL[D]!=0&& INTERNAL HIT |
| [0111] | INPUT SIGNAL[B]!=0&&, INPUT SIGNAL[C]!=0&& INPUT SIGNAL[D]!=0&&, INTERNAL HIT |

FIG. 18

| INPUT SIGNAL [ABCD] | DEVICE ID |
|---|---|
| [1110] | 0 |
| [1101] | 1 |
| [1011] | 2 |
| [0111] | 3 |

RETRIEVING DEVICE AND METHOD, RECORDING MEDIUM, AND PROGRAM FOR ENABLING A PLURALITY OF ASSOCIATIVE MEMORIES FOR RETRIEVAL AND AUTO-STORING

BACKGROUND OF THE INVENTION

The present invention relates to a device and a method for retrieval, a recording medium, and a program that enable a plurality of associative memories to be used suitably.

FIG. 1 shows an example of configuration of an associative memory (content addressable memory (CAM)) 1.

An input control unit 11 latches externally inputted data for retrieval (retrieval data), for example, and then supplies the data to a mask register 12.

On the basis of a mask data selection signal inputted from the input control unit 11, the mask register 12 supplies a CAM block 13 with mask data stored in the mask register 12 to mask a data portion not associated with retrieval.

The CAM block 13 has a plurality of m-bit word memories 21-1, 21-2, . . . , as shown in FIG. 2. (The word memories will be referred to as word memories 21 where they do not need to be individually distinguished from each other. The same is true for other cases.) The word memories 21 can store (enter) therein data to be retrieved (stored data) and a logical value (hereinafter referred to as an empty bit) indicating that the stored data is set as data to be retrieved or not set as data to be retrieved, for example.

Incidentally, when an empty bit indicating that the stored data is not set as data to be retrieved is set, the word memory 21 is treated as a word memory 21 that can store new data when the new data is stored in the CAM 1. Therefore the setting of the empty bit means deletion of the stored data (setting the word memory 21 in an empty state).

In this example, the empty bit indicating that the stored data is set as data to be retrieved (the word memory 21 is not in the empty state) is a logical value 0, while the empty bit indicating that the stored data is not set as data to be retrieved (the word memory 21 is in the empty state) is a logical value 1.

Returning to FIG. 1, a plurality of signal lines 14 (represented by a single line for simplicity in the figure) corresponding to the respective word memories 21 of the CAM block 13 are provided between the CAM block 13 and an output control unit 16. Receiving an instruction to retrieve word memories 21 in the empty state (hereinafter referred to as empty address retrieval) from a control unit 17, the CAM block 13 outputs a logical value (logical value 1) indicating that a word memory 21 is not in the empty state from the signal line 14 of the word memory 21 having an empty bit of the logical value 0 indicating that the word memory 21 is not in the empty state to the output control unit 16. Also, the CAM block 13 outputs a logical value (logical value 0) indicating that a word memory 21 is in the empty state from the signal line 14 of the word memory 21 having an empty bit of the logical value 1 indicating that the word memory 21 is in the empty state to the output control unit 16.

A plurality of signal lines 15 (represented by a single line for simplicity in the figure) corresponding to the respective word memories 21 are further provided between the CAM block 13 and the output control unit 16.

Receiving an instruction to retrieve word memories 21 on the basis of retrieval data (hereinafter referred to as hit address retrieval) from the control unit 17, the CAM block 13 outputs a logical value (logical value 0, for example) indicating a hit to the output control unit 16 from the signal line 15 of the word memory 21 that has an empty bit of the logical value 0 indicating that the word memory 21 is not in the empty state and which stores stored data having a bit pattern matching a portion of the retrieval data that is not masked by the mask register 12. Also, the CAM block 13 outputs a logical value (logical value 1, for example) indicating no hit (a miss) to the output control unit 16 from the signal line 15 of the word memory 21 that has an empty bit of the logical value 0 indicating that the word memory 21 is not in the empty state but which does not store stored data having a bit pattern matching a portion of the retrieval data that is not masked by the mask register 12, or the word memory 21 having an empty bit of the logical value 1 indicating that the word memory 21 is in the empty state.

In the hit address retrieval, the CAM block 13 notifies a result of the retrieval (indicating a hit or a miss) to the control unit 17 as required.

When receiving an instruction for empty address retrieval from the control unit 17, the output control unit 16 detects an address of highest priority (lowest number, for example) from among addresses of word memories 21 corresponding to signal lines 14 that have outputted the logical value indicating that the word memories 21 are in the empty state. The output control unit 16 outputs the address as an address HEA (Highest Empty Address).

Also, when receiving an instruction for hit address retrieval from the control unit 17, the output control unit 16 detects an address of highest priority (lowest number in this example) from among addresses of word memories 21 corresponding to signal lines 15 that have outputted the logical value indicating a hit. The output control unit 16 outputs the address as an address HHA (Highest Hit Address).

The control unit 17 controls each part according to an external control signal. For example, the control unit 17 controls the CAM block 13 and the output control unit 16 to perform empty address retrieval or hit address retrieval based on retrieval data inputted by the input control unit 11. The control unit 17 outputs a result of the hit address retrieval inputted from the CAM block 13 to the outside as required.

The control unit 17 can control the CAM block 13 to store data inputted by the input control unit 11 in the word memory 21 of the address HEA or the address HHA obtained by the empty address retrieval or the hit address retrieval. At this time, the control unit 17 can store the input data in a predetermined part of the word memory 21 using mask data of the mask register 12 (that is, the control unit 17 can change the predetermined part of the word memory 21).

Incidentally, the control unit 17 can control the CAM block 13 and the output control unit 16 to read stored data from the word memory 21 corresponding to an address inputted by the input control unit 11 or write data further inputted by the input control unit 11 to the word memory 21 at the address, as in a normal RAM.

FIG. 3 shows an example of configuration of a network frame repeater 31 using the CAM 1 described above (see Japanese Patent Laid-Open No. Hei 10-255485). The repeater 31 is connected with two networks 32-1 and 32-2. The network 32-1 is connected with three terminals 33-11 to 33-13. The network 32-2 is connected with three terminals 33-21 to 33-23. The repeater 31 is a so-called hub for relaying network frames transmitted and received between terminals 33.

A CPU 41 of the repeater 31 is connected with a packet memory 42, a CAM 1, a RAM 43, and port controllers 45-1 and 45-2 via a bus 46, and controls each of the parts.

The packet memory 42 temporarily stores packets of network frames transmitted to the repeater 31.

Word memories 21 of the CAM 1 (CAM block 13) in this case store addresses on the networks of the terminals 33-11 to 33-13 and the terminals 33-21 to 33-23 and time stamps, as shown in FIG. 4.

The repeater 31 manages time by changing numbers of p time slots in order at predetermined time intervals, as shown in FIG. 5. The time stamps represent the numbers 1, 2, ..., p of the time slots. Incidentally, a method of using the time stamp will be described later.

Returning to FIG. 3, the RAM 43 stores a port number indicating a port 47 via which each terminal 33 is connected. Incidentally, though not described in detail, the RAM 43 stores data of a VLAN (Virtual LAN), data referred to by hardware of the repeater 31, and the like.

An address of each word memory 21 of the CAM 1 and an address of each memory area of the RAM 43 are associated with each other by a signal line 44.

The CAM 1, having a retrieval function added thereto, requires a high cost per bit and has a relatively low memory capacity as compared with ordinary RAMs. Therefore, the CAM 1 and the RAM 43 can be used concurrently as in this example.

The two port controllers 45-1 and 45-2 are connected to the networks 32-1 and 32-2 via ports 47-1 and 47-2. The port controllers 45-1 and 45-2 transmit data supplied from the CPU 41 to a predetermined terminal 33 via the network 32. The port controllers 45-1 and 45-2 also receive data transmitted from a terminal 33, and then supply the data to the CPU 41.

Operation of the repeater 31 will next be described with reference to a flowchart of FIG. 6.

At a step S1, the CPU 41 controls the CAM 1 to start empty address retrieval and processing for securing word memories 21 in an empty state.

Thereby the CAM 1 starts processing (empty address retrieval) for retrieving word memories 21 in the empty state (word memories 21 having an empty bit indicating that the word memory 21 is in the empty state), detecting a highest-priority address (lowest-number address) among addresses of the retrieved word memories 21, and outputting the address as an address HEA. The CAM 1 also starts processing for retrieving word memories 21 storing a number of a time slot (time stamp) preceding a time slot at a present time supplied from the CPU 41 as required, and changing empty bits of the retrieved word memories 21 to a logical value indicating that the word memories 21 are in the empty state (processing for deleting stored data of the predetermined word memories 21 and securing the word memories 21 in the empty state).

At a next step S2, the CPU 41 stands by until a network frame is inputted from the port controller 45 via the bus 46. When a network frame is inputted, the CPU 41 proceeds to a step S3.

At the step S3, the CPU 41 temporarily stores the inputted network frame in the packet memory 42, and extracts a destination address DA indicating a destination of data transfer (transmission) from a header portion of the stored network frame. Then, the CPU 41 controls the CAM 1 to perform hit address retrieval using the destination address DA as retrieval data.

Incidentally, the header portion of the network frame stores the destination address DA, a source address SA indicating a transmission source, and the like.

The CAM 1 performs hit address retrieval on the basis of the retrieval data (the address DA in this case) supplied from the CPU 41. When the CAM 1 can detect an address HHA in the hit address retrieval, the CAM 1 notifies the hit to the CPU 41, and outputs the address HHA to the RAM 43 via the signal line 44. Incidentally, the address of a terminal 33 as the transmission destination is stored in a word memory 21 of the CAM 1 (CAM block 13).

The CPU 41 reads, from the RAM 43, a port number stored in a memory area corresponding to the address HHA detected by the CAM 1.

At a next step S4, the CPU 41 transmits the network frame inputted at the step S2 to the destination terminal 33 via the port 47 corresponding to the port number read at the step S3 and the network 32.

At a step S5, the CPU 41 extracts the source address SA indicating the transmission source from the network frame stored in the packet memory 42, and controls the CAM 1 to perform hit address retrieval using the source address SA as retrieval data.

Thereby the CAM 1 performs hit address retrieval based on the retrieval data (the address SA in this case) from the CPU 41, and then notifies a result of the hit address retrieval to the CPU 41.

At a step S6, the CPU 41 determines whether or not an address HHA is detected on the basis of the notification from the CAM 1. When the CPU 41 determines that an address HHA is detected (when the address SA of the transmission source is stored in a word memory 21), the CPU 41 proceeds to a step S7.

At the step S7, the CPU 41 controls the CAM 1 to update the time stamp. Thereby the CAM 1 replaces the time stamp in the word memory 21 corresponding to the address HHA with the time stamp at the present time supplied from the CPU 41. When the time stamp of a terminal 33 as the transmission source (a terminal 33 using the repeater 31) is thus updated, the address of the terminal 33 on the network is not deleted in the processing of the step S1. Hence, in the processing of the step S1, addresses of terminals 33 that have not used the repeater 31 recently are deleted to secure word memories 21 in the empty state.

When the CPU 41 determines at the step S6 that no address HHA is detected, the CPU 41 proceeds to a step S8, where the CPU 41 controls the CAM 1 to store the source address SA of the transmission source and the time stamp at the present time.

Thereby the CAM 1 stores the source address SA and the time stamp at the present time supplied from the CPU 41 in the word memory 21 of the address HEA (the word memory 21 in the empty state) detected in the processing of the step S1. At this time, the CPU 41 stores a port number of the inputted network frame in a memory area of the RAM 43 which area corresponds to the address HEA.

After the processing of the step S7 or the step S8 is performed, the CPU 41 returns to the step S2 to repeat the processing from the step S2 on down.

In the example of FIG. 3, the stored data is relatively small in amount, representing the network addresses of the six terminals 33 and time stamps. However, when a number of terminals 33 for relay is increased and the stored data becomes larger in data amount (when a number of entries is increased), one CAM 1 cannot manage the data. In this case, as shown in FIG. 7, for example, a plurality of CAMs 1 (four CAMs 1-1 to 1-4 in the example of FIG. 7) are used in cascade connection (to be described later in detail). Incidentally, the CAMs 1-1 to 1-4 as a whole will be referred to as a connected CAM 2 as appropriate.

Addresses of word memories 21 of the CAMs 1-1 to 1-4 including the connected CAM 2 are set in order from the CAM 1-1 to the CAM 1-4, as shown in FIG. 8. Specifically, in terms of the CAM 1 units, the CAM 1-1 has addresses of highest priority; the CAM 1-2 has addresses of priority next to that of the CAM 1-1; the CAM 1-3 has addresses of priority next to that of the CAM 1-2; and the CAM 1-4 has addresses of lowest priority.

Also in this case, the connected CAM 2 as a whole outputs one address HHA or address HEA as a result of empty address retrieval or hit address retrieval. In detection of the address HHA or address HEA, the CAMs 1 ultimately have priority (precedence) in order of the CAM 1-1, the CAM 1-2, the CAM 1-3, and the CAM 1-4.

Main operation of the connected CAM 2 will be described in the following. When the connected CAM 2 performs empty address retrieval (step S1 in FIG. 6), each CAM 1 performs empty address retrieval, and transmits a result of the empty address retrieval to CAMs 1 of lower priority than the CAM 1 itself, as shown by signal lines 61 in FIG. 7. Specifically, a result of the retrieval of the CAM 1-1 is transmitted to the CAM 1-2 (signal line 61-3), the CAM 1-3 (signal line 61-2), and the CAM 1-4 (signal line 61-1). A result of the retrieval of the CAM 1-2 is transmitted to the CAM 1-3 (signal line 61-5) and the CAM 1-4 (signal line 61-4). A result of the retrieval of the CAM 1-3 is transmitted to the CAM 1-4 (signal line 61-6).

Each CAM 1 detects and outputs an address HEA according to a result of the retrieval of the CAMs 1 of higher priority than the CAM 1 itself.

Specifically, since the CAM 1-1 has the highest priority, when the CAM 1-1 can retrieve a word memory 21 in an empty state from a CAM block 13 of the CAM 1-1 itself, the CAM 1-1 detects an address HEA from an address of the retrieved word memory 21, and then outputs the address HEA. That is, in this case, the address HEA of the CAM 1-1 is outputted as the address HEA of the connected CAM 2.

In the case where the CAM 1-1 retrieves the word memory 21 in the empty state, the CAM 1-2 does not output an address HEA even when a word memory 21 in the empty state is retrieved from a CAM block 13 of the CAM 1-2 itself. When the CAM 1-1 does not retrieve a word memory 21 in the empty state, on the other hand, the CAM 1-2 detects the address HEA from an address of the word memory 21 in the empty state retrieved by the CAM 1-2 itself, and then outputs the address HEA. That is, in this case, the address HEA of the CAM 1-2 is outputted as the address HEA of the connected CAM 2.

In the case where one of the CAMs 1-1 and 1-2 retrieves the word memory 21 in the empty state, the CAM 1-3 does not output an address HEA even when a word memory 21 in the empty state is retrieved from a CAM block 13 of the CAM 1-3 itself. When none of the CAMs 1-1 and 1-2 retrieve a word memory 21 in the empty state, on the other hand, the CAM 1-3 detects the address HEA from an address of the word memory 21 in the empty state retrieved by the CAM 1-3 itself, and then outputs the address HEA. That is, in this case, the address HEA of the CAM 1-3 is outputted as the address HEA of the connected CAM 2.

In the case where one of the CAMs 1-1, 1-2, and 1-3 retrieves the word memory 21 in the empty state, the CAM 1-4 does not output an address HEA even when a word memory 21 in the empty state is retrieved from a CAM block 13 of the CAM 1-4 itself. When none of the CAMs 1-1, 1-2, and 1-3 retrieve a word memory 21 in the empty state, on the other hand, the CAM 1-4 detects the address HEA from an address of the word memory 21 retrieved by the CAM 1-4 itself, and then outputs the address HEA. That is, in this case, the address HEA of the CAM 1-4 is outputted as the address HEA of the connected CAM 2.

Thus, the address HEA of the connected CAM 2 as a whole is detected. Incidentally, the address HEA thus detected is supplied to a RAM 43 via a signal line 44.

When the connected CAM 2 performs hit address retrieval (step S5 in FIG. 6), each CAM 1 performs hit address retrieval based on retrieval data (source address SA) from a CPU 41, and then transmits a result of the retrieval to both CAMs 1 of higher priority than the CAM 1 itself and CAMs 1 of lower priority than the CAM 1 itself (transmits the result to the other CAMs 1), as indicated by signal lines 71 in FIG. 7.

Specifically, a result of the retrieval of the CAM 1-1 is transmitted to the CAM 1-2 (signal line 71-3), the CAM 1-3 (signal line 71-2), and the CAM 1-4 (signal line 71-1). A result of the retrieval of the CAM 1-2 is transmitted to the CAM 1-1 (signal line 71-3), the CAM 1-3 (signal line 71-5), and the CAM 1-4 (signal line 71-4). A result of the retrieval of the CAM 1-3 is transmitted to the CAM 1-1 (signal line 71-2), the CAM 1-2 (signal line 71-5), and the CAM 1-4 (signal line 71-6). A result of the retrieval of the CAM 1-4 is transmitted to the CAM 1-1 (signal line 71-1), the CAM 1-2 (signal line 71-4), and the CAM -1-3 (signal line 71-6).

Each CAM 1 detects and outputs an address HHA according to a result of the retrieval of the CAMs 1 of higher priority than the CAM 1 itself.

Specifically, when the CAM 1-1 hits as a result of searching the CAM 1-1 itself, the CAM 1-1 detects an address HHA from an address of a retrieved word memory 21, and then outputs the address HHA regardless of results of the retrieval of the CAMs 1-2 to 1-4 (even when there is a hit in the CAMs 1-2 to 1-4).

In the case where the CAM 1-1 hits, the CAM 1-2 does not output an address HHA even when the CAM 1-2 itself hits. When the CAM 1-1 misses, on the other hand, the CAM 1-2 detects an address HHA from an address of a word memory 21 retrieved by the CAM 1-2 itself, and then outputs the address HHA.

In the case where one of the CAMs 1-1 and 1-2 hits, the CAM 1-3 does not output an address HHA even when the CAM 1-3 itself hits. When each of the CAMs 1-1 and 1-2 misses, on the other hand, the CAM 1-3 detects an address HHA from an address of a word memory 21 retrieved by the CAM 1-3 itself, and then outputs the address HHA.

In the case where one of the CAMs 1-1, 1-2, and 1-3 hits, the CAM 1-4 does not output an address HHA even when the CAM 1-4 itself hits. When each of the CAMs 1-1, 1-2, and 1-3 misses, on the other hand, the CAM 1-4 detects an address HHA from an address of a word memory 21 retrieved by the CAM 1-4 itself, and then outputs the address HHA.

Thus, the address HHA of the connected CAM 2 as a whole is detected. Incidentally, the address HHA thus detected is supplied to the RAM 43 via the signal line 44.

When the connected CAM 2 as a whole detects one address HHA and updates a time stamp in the word memory 21 corresponding to the address HHA (step S7 in FIG. 6), the CAM 1 that has detected the address HHA as described above updates the time stamp in the word memory 21 corresponding to the address HHA.

When the connected CAM 2 as a whole does not detect an address HHA and stores a source address SA and a time stamp at a present time at the address HEA (step S8), the CAM 1 that has detected the address HEA as described above stores the source address SA and the like in the word memory 21 of the address HEA.

Thus, the hit address retrieval (step S5) and the updating of the time stamp (step S7) or the storing of the source address SA and the like (step S8) on the basis of a result of the hit address retrieval are performed. These three steps will hereinafter be referred to collectively as auto-store processing as appropriate.

However, the CAMs 1 and the signal lines 71 shown in FIG. 7 are connected in a complex manner as shown in FIG. 9.

For this connection, each CAM 1 has one output terminal 81, three input terminals 82A to 82C, and three input terminals 83A to 83C. The output terminal 81 outputs a result of hit address retrieval. The input terminals 82 are supplied with results of hit address retrieval of the CAMs 1 of higher priority than the CAM 1 itself. The input terminals 83 are supplied with results of hit address retrieval of the CAMs 1 of lower priority than the CAM 1 itself.

Each CAM 1 will be described. The output terminal 81-1 of the CAM 1-1 is connected to the input terminals 82-2C, 82-3C, and 82-4C of their respective CAMs 1-2, 1-3, and 1-4, and outputs a result (logical value 1 or 0) of hit address retrieval of the CAM 1-1 to the input terminals 82-2C, 82-3C, and 82-4C. Since there are no CAMs 1 of higher priority than the CAM 1-1, the input terminals 82-1A to 82-1C of the CAM 1-1 are pulled up to ignore inputs to the input terminals 82-1A to 82-1C, The input terminals 83-1A, 83-1B, and 83-1C are connected to the output terminals 81-2, 81-3, and 81-4 of their respective CAMs 1-2, 1-3, and 1-4, and are supplied with retrieval results of the CAMs 1-2, 1-3, and 1-4.

The output terminal 81-2 of the CAM 1-2 is connected to the input terminals 83-1A, 82-3B, and 82-4B of their respective CAMs 1-1, 1-3, and 1-4, and outputs a result (logical value 1 or 0) of hit address retrieval of the CAM 1-2 to the input terminals 83-1A, 82-3B, and 82-4B. The input terminal 82-2C is connected to the output terminal 81-1 of the CAM 1-1, and is supplied with a retrieval result of the CAM 1-1. Since only the CAM 1-1 is of higher priority than the CAM 1-2, the remaining input terminals 82-2A and 82-2B of the CAM 1-2 are pulled up to ignore inputs to the input terminals 82-2A and 82-2B. The input terminals 83-2B and 83-2C are connected to the output terminals 81-3 and 81-4 of their respcetive CAMs 1-3 and 1-4, and are supplied with retrieval results of the CAMs 1-3 and 1-4. Since only the CAMs 1-3 and 1-4 are of lower priority than the CAM 1-2, the remaining input terminal 83-2A is pulled up to ignore inputs to the input terminal 83-2A.

The output terminal 81-3 of the CAM 1-3 is connected to the input terminals 83-1B, 83-2B, and 82-4A of their respective CAMs 1-1, 1-2, and 1-4, and outputs a retrieval result of the CAM 1-3 to the input terminals 83-1B, 83-2B, and 82-4A. The input terminals 82-3B and 82-3C are connected to the output terminals 81-2 and 81-1 of their respective CAMs 1-2 and 1-1, and are supplied with retrieval results of the CAMs 1-2 and 1-1. Since only the CAMs 1-1 and 1-2 are of higher priority than the CAM 1-3, the remaining input terminal 82-3A is pulled up to ignore inputs to the input terminal 82-3A. The input terminal 83-3C is connected to the output terminal 81-4 of the CAM 1-4, and is supplied with a retrieval result of the CAM 1-4. Since only the CAM 1-4 is of lower priority than the CAM 1-3, the remaining input terminals 83-3A and 83-3B are pulled up to ignore inputs to the input terminals 83-3A and 83-3B.

The output terminal 81-4 of the CAM 1-4 is connected to their respective input terminals 83-1C, 83-2C, and 83-3C of the CAMs 1-1, 1-2, and 1-3, and outputs a retrieval result of the CAM 1-4 to the input terminals 83-1C, 83-2C, and 83-3C. The input terminals 82-4A, 82-4B, and 82-4C are connected to the output terminals 81-3, 81-2, and 81-1 of their respective CAMs 1-3, 1-2, and 1-1, and are supplied with retrieval results of the CAMs 1-3, 1-2, and 1-1. Since there are no CAMs 1 of lower priority than the CAM 1-4, the input terminals 83-4A to 83-4C are pulled up to ignore inputs to the input terminals 83-4A to 83-4C.

When a signal of a logical value 1 is inputted to all the input terminals 82A, 82B, and 82C of the CAM 1 (when the CAMs 1 of higher priority than the CAM 1 miss), the CAM 1 detects an address HHA from an address of a word memory 21 retrieved by the CAM 1 itself, and updates a time stamp in the word memory 21 of the address HHA.

When the connected CAM 2 as a whole misses (when a signal of the logical value 1 is inputted to all the input terminals 82 and 83 of each CAM 1), the CAM 1 stores an address SA and the like in a word memory 21 of a detected address HEA.

Incidentally, the output of the output terminal 81 and the input of the input terminals 82 and 83 of each CAM 1 are controlled by a control unit 17 as shown in FIG. 10.

Thus, conventionally, each CAM 1 has the input terminals 82 and the input terminals 83 for inputting retrieval results from CAMs 1 of higher priority than the CAM 1 itself and from CAMs 1 of lower priority than the CAM 1 itself separately from each other (each CAM 1 has the input terminals 82 and the input terminals 83 that are each smaller in number by one than the number of CAMs 1 comprising the connected CAM 2 (3 (=4−1) in the example of FIG. 9)). Therefore the connection of the input terminals 82 and the input terminals 83 with the output terminals 81 of the CAMs 1 is complex, and thus the configuration of the connected CAM 2 is complex.

Incidentally, although it is possible to grasp a retrieval result of each CAM 1 by an open drain system, the processing cannot be performed rapidly.

SUMMARY OF THE INVENTION

The present invention has been made in view of the above, and it is accordingly an object of the present invention to simplify the connection of the connected CAM 2 that performs auto-store processing.

According to the present invention, there is provided a retrieving device including: retrieving element for retrieving a memory part corresponding to retrieval data from memory parts possessed by the retrieving element itself; first output control element for controlling output of an initial signal to other retrieving devices; second output control element for controlling output of a retrieval result signal indicating whether a memory part corresponding to the retrieval data is retrieved by the retrieving element to the other retrieving devices; N first input element connected to the other retrieving devices, for inputting retrieval result signals or initial signals from the other retrieving devices; second input element for inputting a reference signal; obtaining element for obtaining a priority signal in which the initial signals and the reference signal are disposed according to a predetermined priority; detecting element for detecting the first input element that input an initial signal of higher priority than the priority corresponding to the reference signal, on the basis of the priority signal; output element for detecting a predetermined memory part from the memory part retrieved by the retrieving element and outputting the predetermined memory part as a retrieval result of a retrieving system as a whole according to a content of the retrieval result signal inputted by the first input element detected by the detecting element; and performing element for determining that no memory part corresponding to the retrieval data is retrieved in all the other retrieving devices on the basis of the retrieval result signals inputted by the first input element, and performing predetermined processing when no memory part corresponding to the retrieval data is retrieved in all the other retrieving devices. According to the present invention, a plurality of CAMs can be used suitably by a simple connection.

BRIEF DESCRIPTION OF THE DRAWINGS

Figure 2:
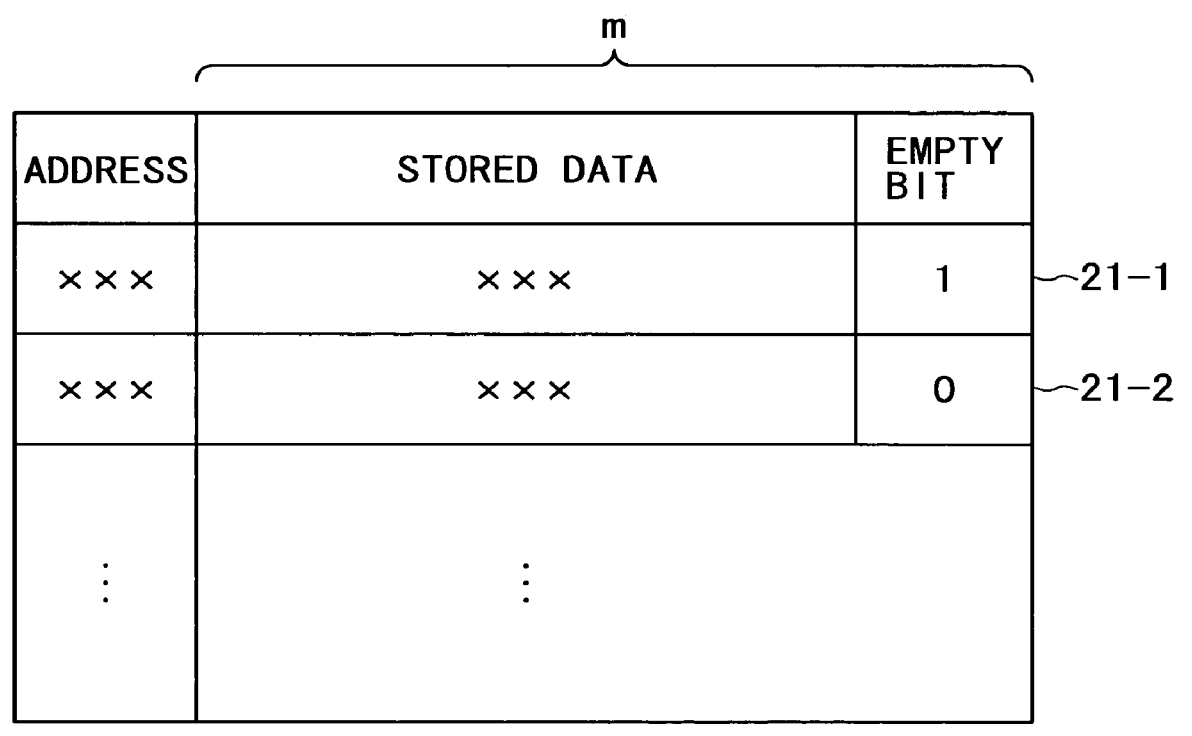

FIG. 2 is a diagram showing an example of configuration of word memories in the CAM of FIG. 1;

FIG. 3 is a block diagram showing an example of configuration of a repeater;

FIG. 8 is a diagram showing an example of configuration of word memories in CAMs of FIG. 7;

FIG. 18 is a diagram of assistance in explaining device IDs.

DETAILED DESCRIPTION OF THE PREFERRED EMBODIMENTS

Figure 11:
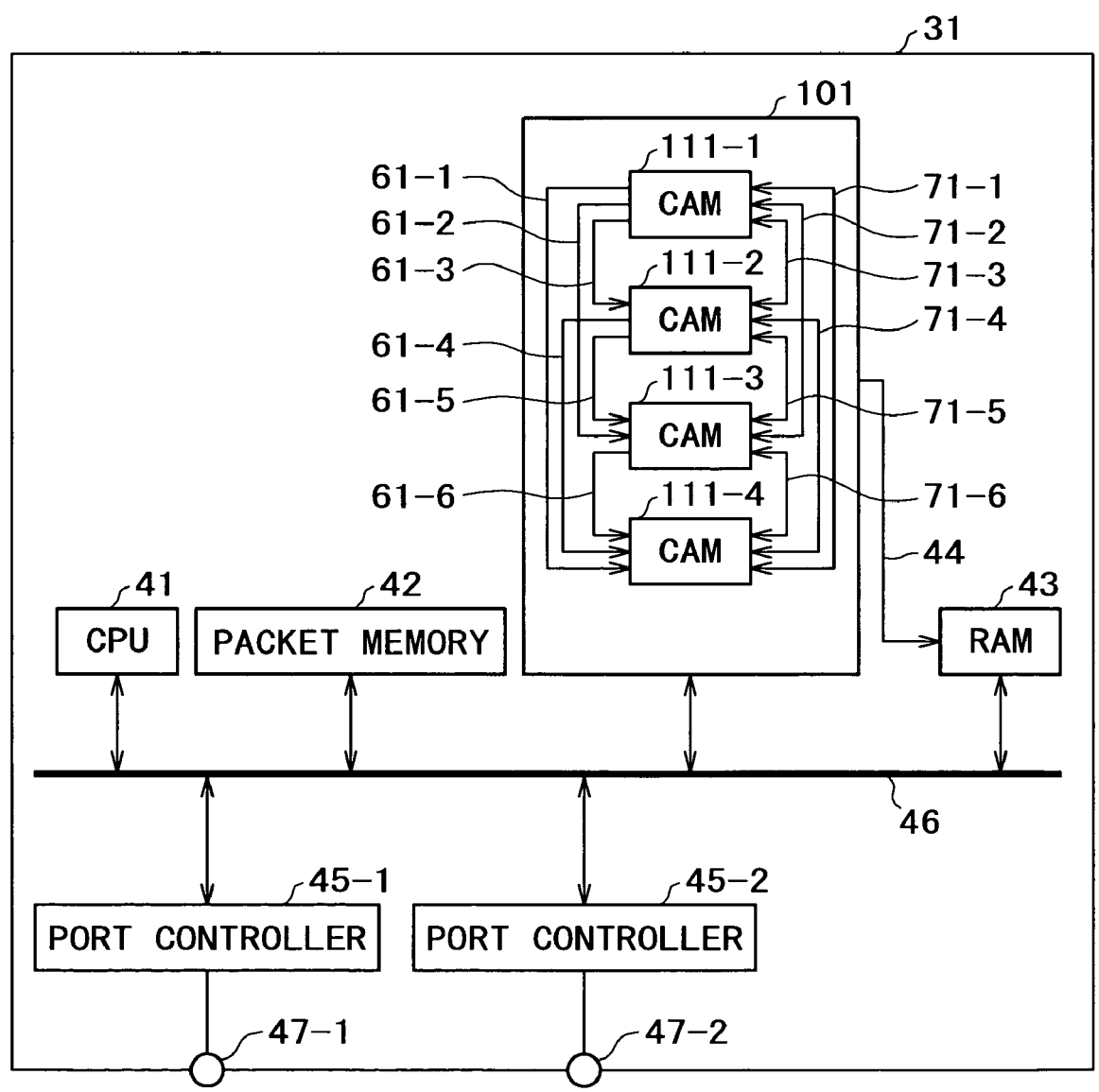
FIG. 11 is a block diagram showing an example of configuration of a repeater using CAMs to which the present invention is applied.

FIG. 11 shows an example of configuration of a repeater 31 using a connected CAM 101 to which the present invention is applied. Since parts other than the connected CAM 101 in FIG. 11 are the same as in the repeater 31 in FIG. 7, the parts are identified by the same reference numerals as in FIG. 7, and description of the parts will be omitted.

Figure 1:
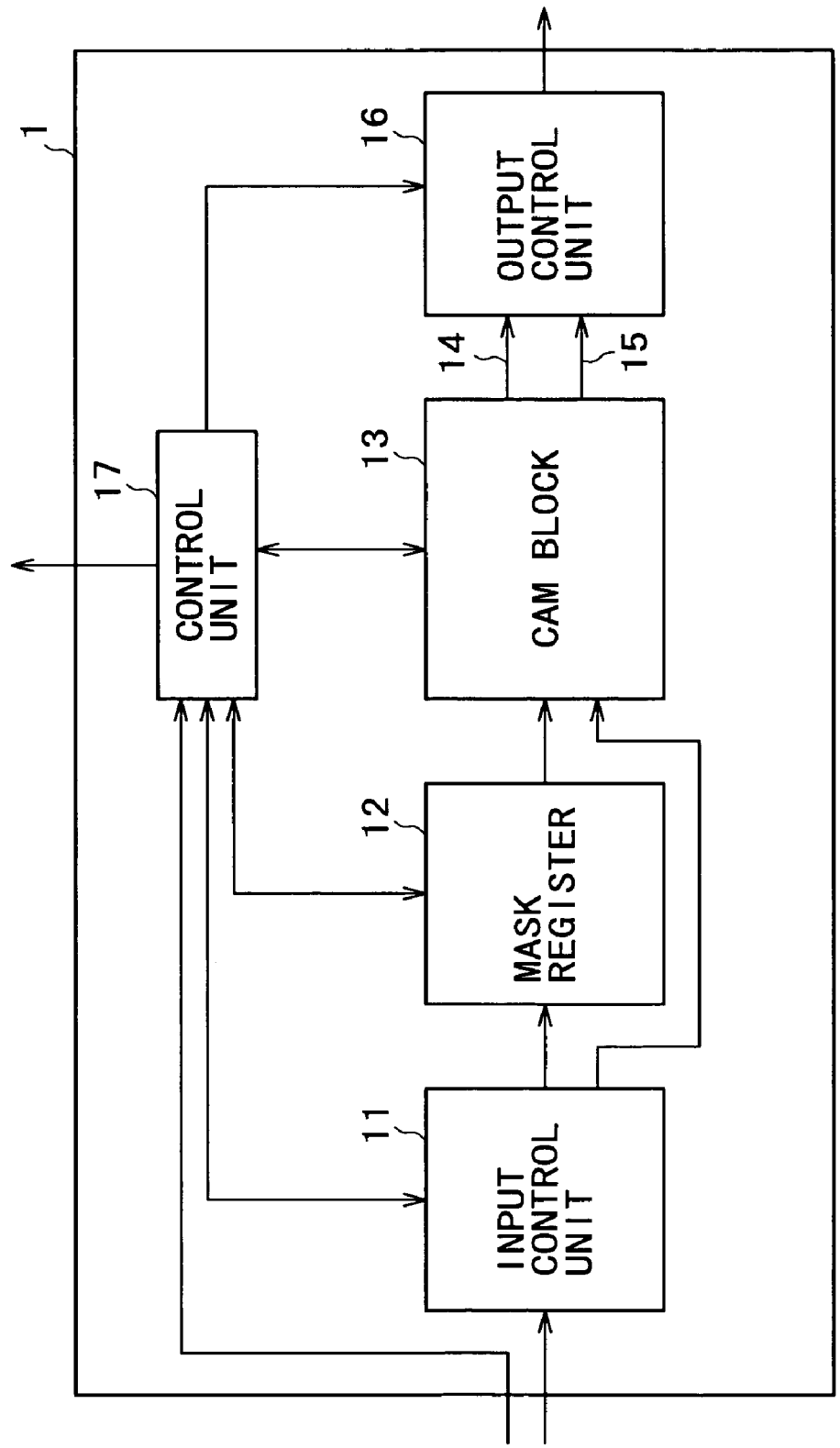
FIG. 1 is a block diagram showing an example of configuration of a CAM.
Figures 4, 5:
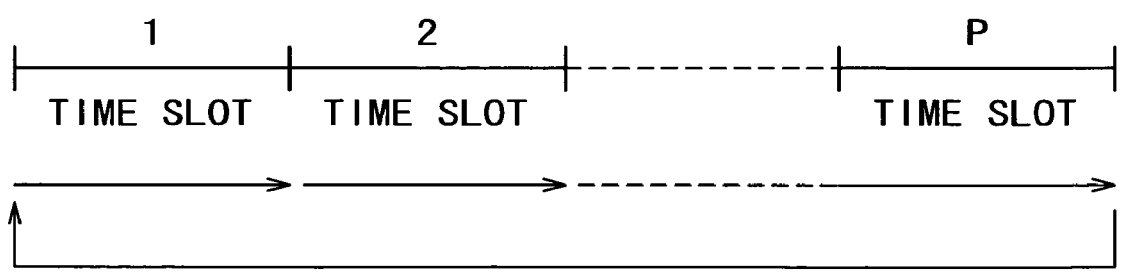
FIG. 4 is a diagram showing an example of configuration of word memories in a CAM of FIG. 3.
FIG. 5 is a diagram of assistance in explaining a time stamp.
Figure 6:
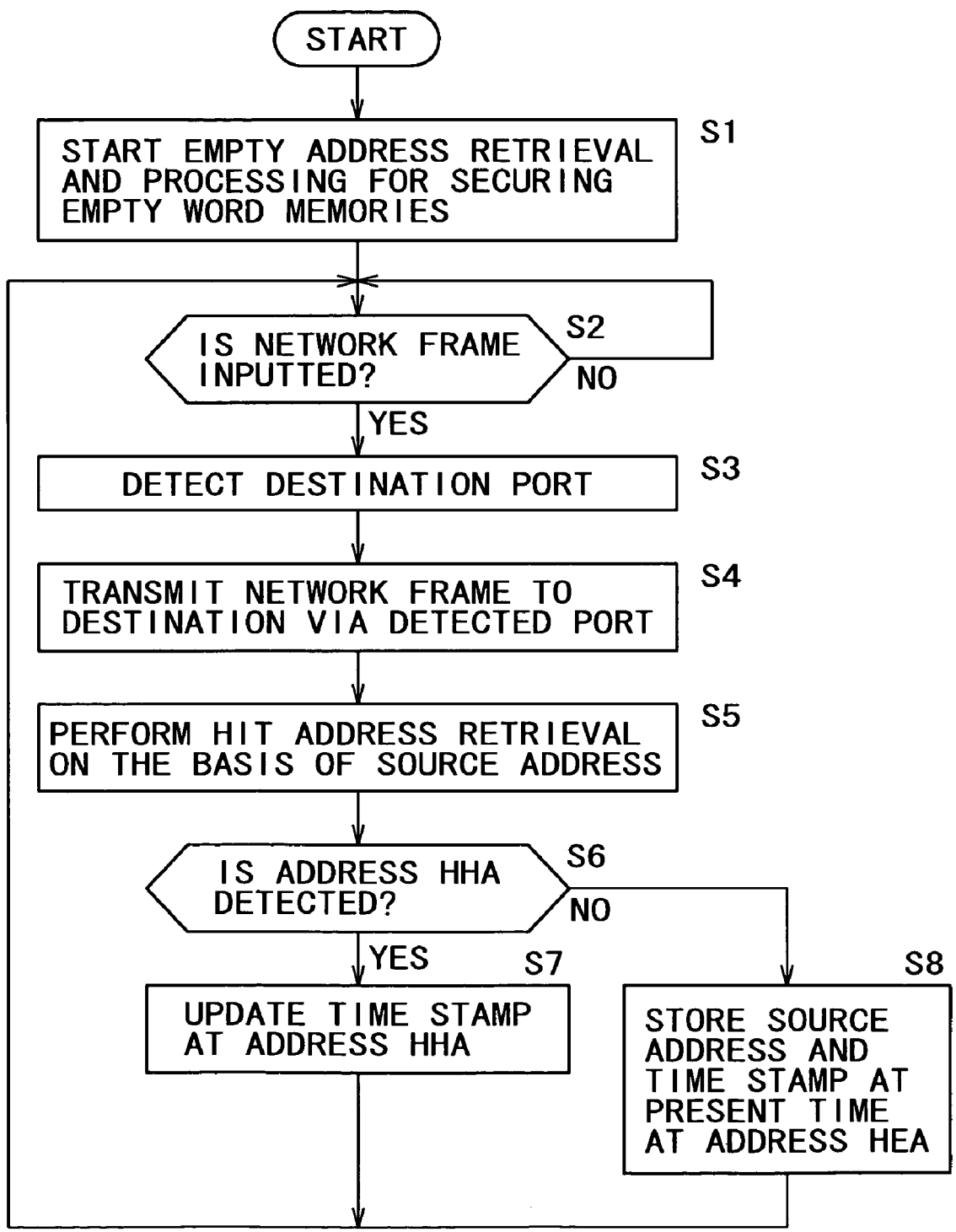
FIG. 6 is a flowchart of assistance in explaining operation of the CAM of FIG. 3.
Figure 7:
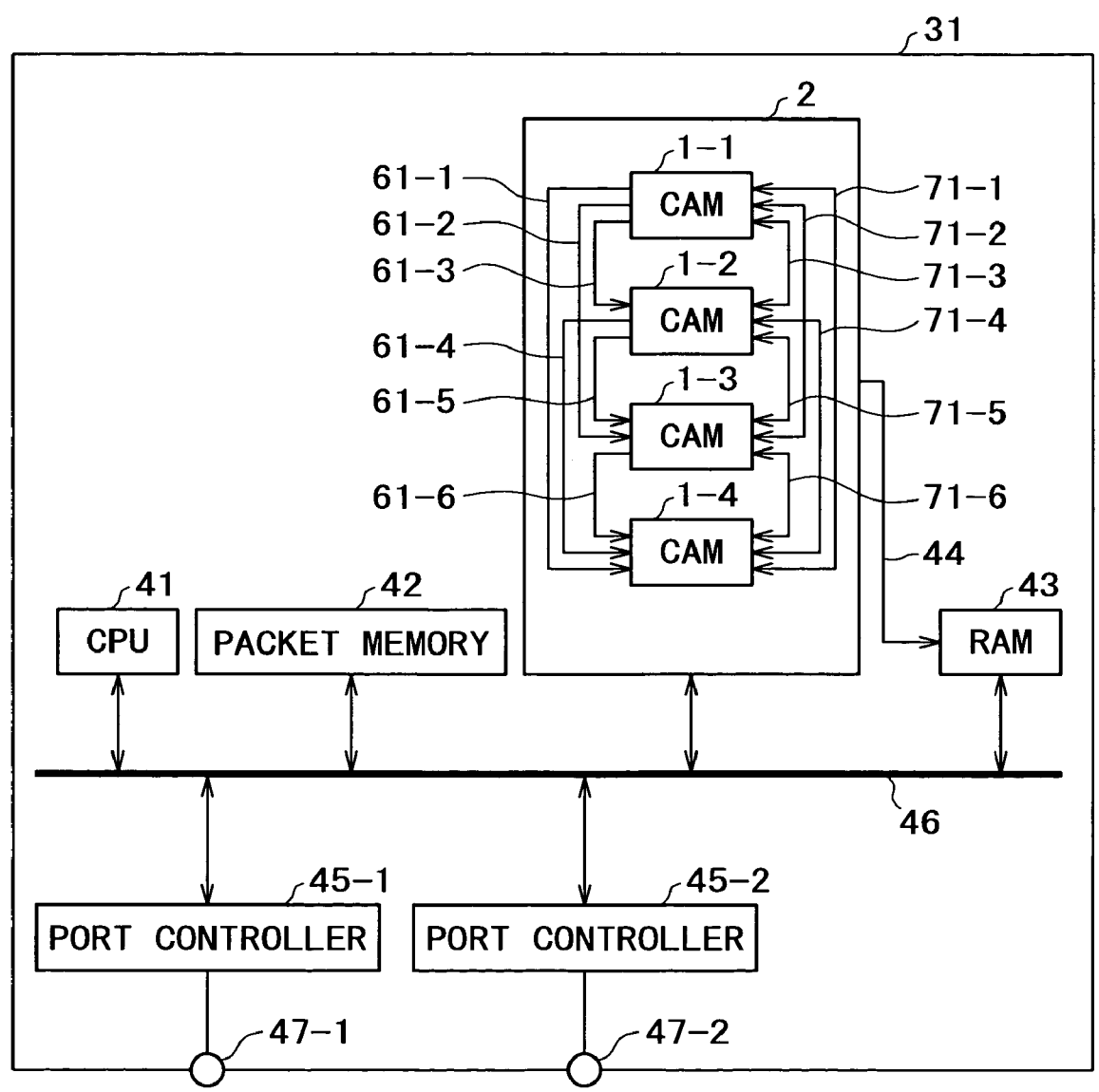
FIG. 7 is a block diagram showing another example of configuration of a repeater.
Figure 9:
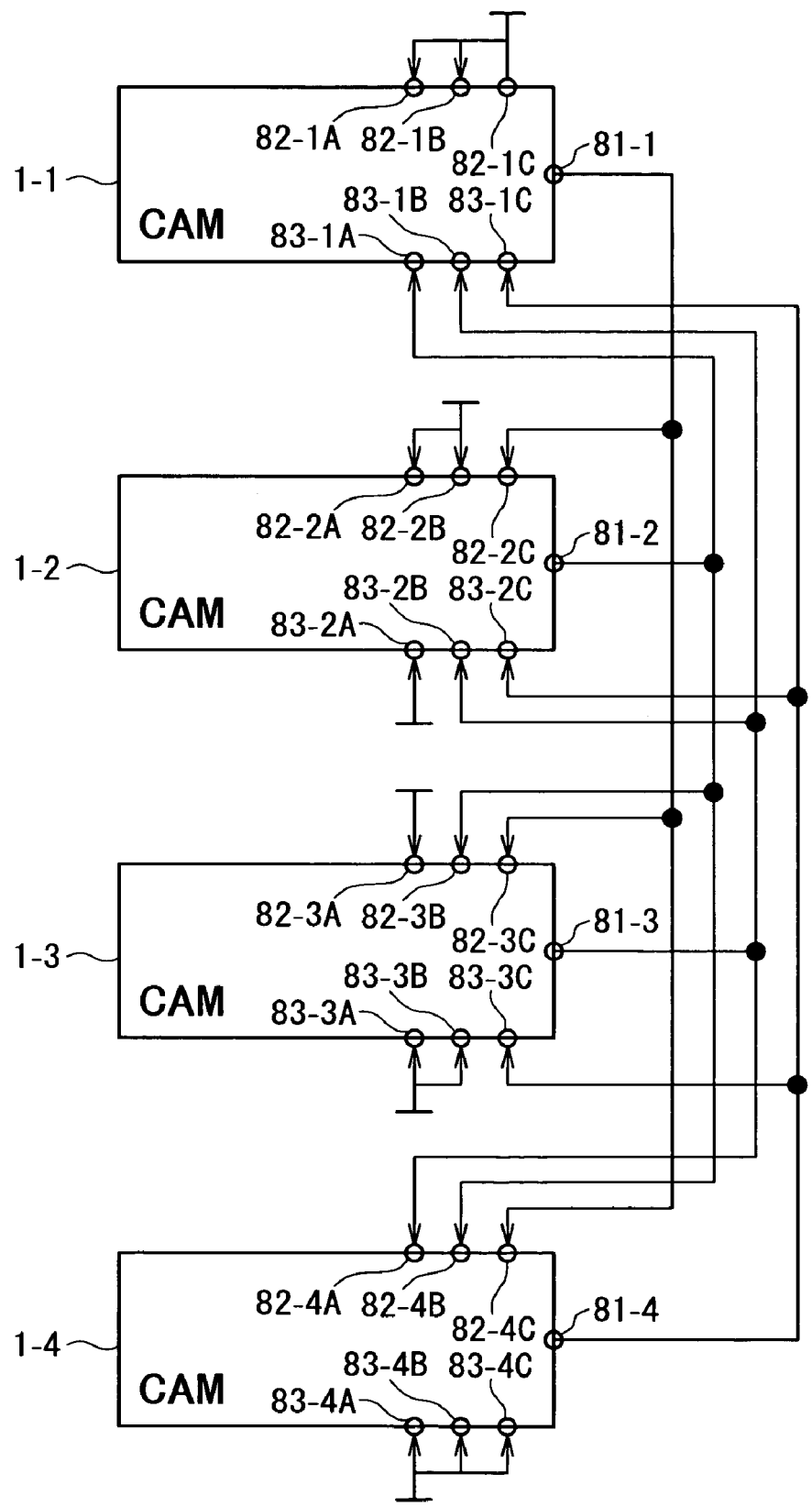
FIG. 9 is a diagram showing an example of connection of the CAMs of FIG. 7.

Word memories 21 of CAMs 111-1 to 111-4 comprising the connected CAM 101 have the same configuration as shown in FIG. 8 in the CAMs 1-1 to 1-4 shown in FIG. 7. That is, for detection of an address HHA or an address HEA in empty address retrieval or hit address retrieval, the CAM 1-1, the CAM 1-2, the CAM 1-3, and the CAM 1-4 have priority (precedence) decreasing in that order.

Figure 12:
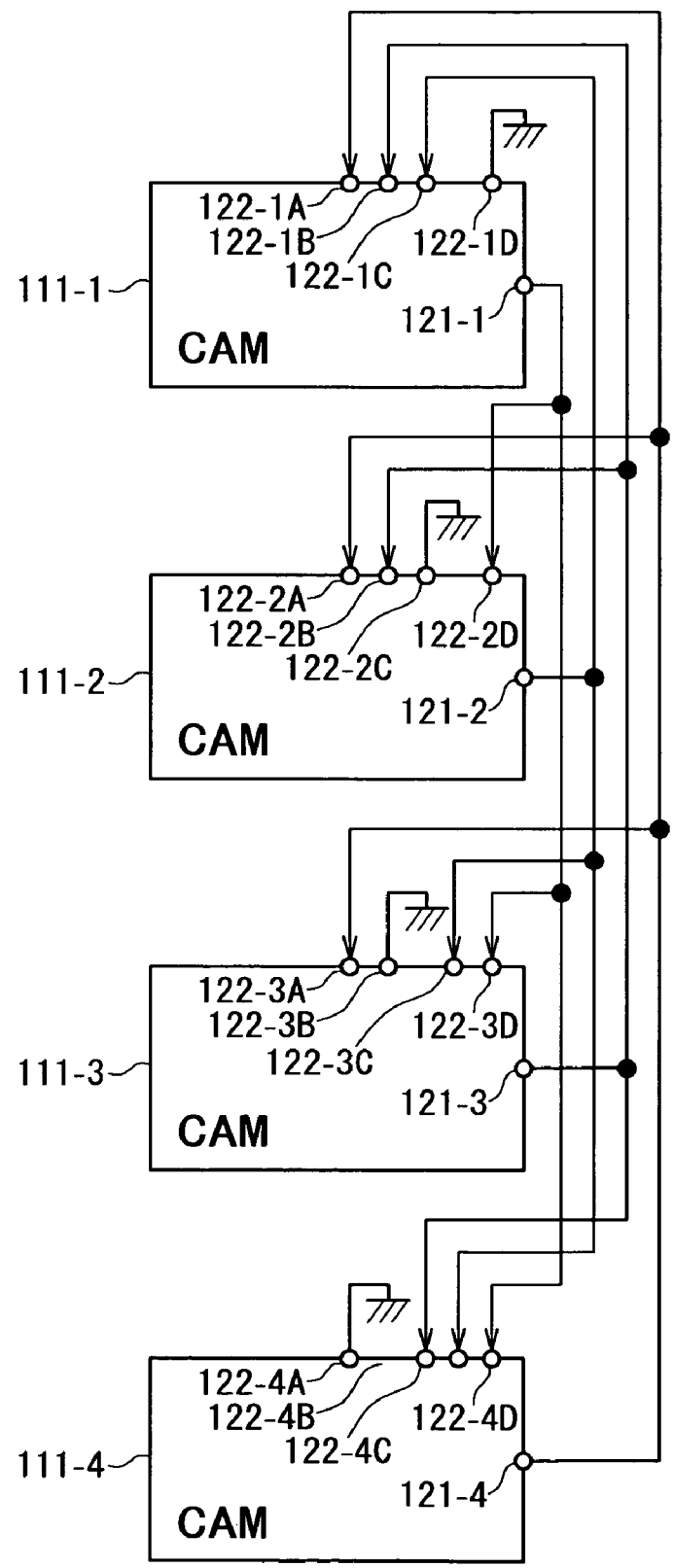
FIG. 12 is a diagram showing an example of connection of the CAMs of FIG. 11.

FIG. 12 shows an example of connection (a concrete example of connection of signal lines 71 shown in FIG. 11) for the connected CAM 101 to perform auto-store processing. For this connection, each CAM 111 has one output terminal 121 and four input terminals 122A, 122B, 122C, and 122D.

Of the four input terminals 122, one input terminal corresponding to the priority of the CAM 111 (the input terminal 122-1D of the CAM 111-1, the input terminal 122-2C of the CAM 111-2, the input terminal 122-3B of the CAM 111-3, and the input terminal 122-4A of the CAM 111-4 in this case) is pulled down to input a logical value 0 at all times. The other three of the input terminals 122 are connected to the output terminals 121 of the other CAMs 111.

Each of the CAMs 111 will be described. The output terminal 121-1 of the CAM 111-1 is connected to the input terminals 122-2D, 122-3D, and 122-4D of their respective CAMs 111-2, 111-3, and 111-4, and outputs a result (a logical value 1 or 0) of hit address retrieval in the CAM 111-1. The input terminals 122-1A, 122-1B, and 122-1C of the CAM 111-1 are connected to the output terminals 121-4, 121-3, and 121-2 of their respective CAMs 111-4, 111-3, and 111-2, and input a result of retrieval in the CAMs 111-4, 111-3, and 111-2. The input terminal 122-1D of the CAM 111-1 is pulled down.

The output terminal 121-2 of the CAM 111-2 is connected to the input terminals 122-1C, 122-3C, and 122-4C of their respecive CAMs 111-1, 111-3, and 111-4, and outputs a result of retrieval in the CAM 111-2. The input terminals 122-2A, 122-2B, and 122-2D of the CAM 111-2 are connected to the output terminals 121-4, 121-3, and 121-1 of the CAMs 111-4, 111-3, and 111-1, and input a result of retrieval in the CAMs 111-4, 111-3, and 111-1. The input terminal 122-2C of the CAM 111-2 is pulled down.

The output terminal 121-3 of the CAM 111-3 is connected to the input terminals 122-1B, 122-2B, and 122-4B of the CAMs 111-1, 111-2, and 111-4, and outputs a result of retrieval in the CAM 111-3 to the input terminals 122-1B, 122-2B, and 122-4B. The input terminals 122-3A, 122-3C, and 122-3D of the CAM 111-3 are connected to the output terminals 121-4, 121-2, and 121-1 of their respective CAMs 111-4, 111-2, and 111-1, and input a result of retrieval in the CAMs 111-4, 111-2, and 111-1. The input terminal 122-3B of the CAM 111-3 is pulled down.

The output terminal 121-4 of the CAM 111-4 is connected to the input terminals 122-1A, 122-2A, and 122-3A of their respective CAMs 111-1, 111-2, and 111-3, and outputs a result of retrieval in the CAM 111-4 to the input terminals 122-1A, 122-2A, and 122-3A. The input terminals 122-4B, 122-4C, and 122-4D of the CAM 111-4 are connected to the output terminals 121-3, 121-2, and 121-1 of their respective CAMs 111-3, 111-2, and 111-1, and input a result of retrieval in the CAMs 111-3, 111-2, and 111-1. The input terminal 122-4A of the CAM 111-4 is pulled down.

In the following, description will be made of operation of each of the CAMs 111 when the connected CAM 101 performs auto-store processing (processing of performing hit address retrieval and updating a time stamp in a word memory 21 of an address HHA according to a result of the retrieval or storing a source address SA and the like in a word memory 21 of an address HEA) with reference to a flowchart of FIG. 14.

At a step S11, prior to starting auto-store processing, each CAM 111 recognizes an input terminal 122 that inputs an output from a CAM 111 having a higher priority than the CAM 111 itself on the basis of an input signal [ABC]

including initial signals and a signal of a logical value 0 from the input terminals 122A, 122B, 122C, and 122D.

Figure 13:
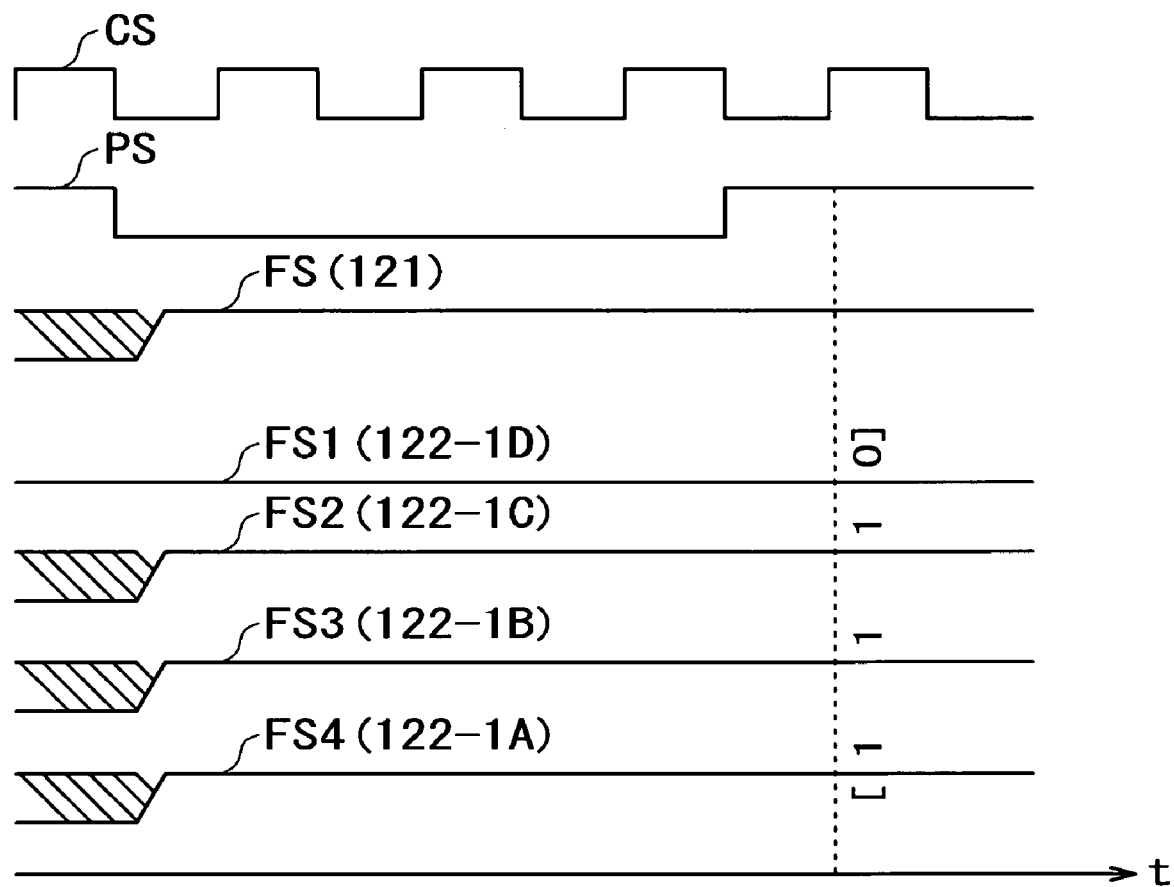
FIG. 13 is a diagram of assistance in explaining an input signal.

Specifically, a clock CS and a reset signal PS shown in FIG. 13 are inputted from a CPU 41 to each CAM 111. The CAM 111 outputs an initial signal FS corresponding to a logical value 1 from the output terminal 121 in timing of a first rising edge of the clock CS after reset (in timing indicated by a vertical dotted line in FIG. 13).

As a result, an input signal [1110] is inputted to the CAM 111-1, for example. Specifically, an initial signal FS4 of a logical value 1 (an output from the output terminal 121-4 of the CAM 111-4) is inputted to the input terminal 122-1A; an initial signal FS3 of a logical value 1 (an output from the output terminal 121-3 of the CAM 111-3) is inputted to the input terminal 122-1B; an input signal FS2 of a logical value 1 (an output from the output terminal 121-2 of the CAM 111-2) is inputted to the input terminal 122-1C; and a signal FS1 of a logical value 0 is inputted to the input terminal 122-1D.

Similarly, an input signal [1101], an input signal [1011], and an input signal [0111] are inputted to the CAM 111-2, the CAM 111-3, and the CAM 111-4, respectively.

That is, the input signal [ABCD] at the time of reset is unique to the CAM 111, having zero disposed at a position corresponding to the priority of the CAM 111.

When the input signal [ABCD] at the time of reset is thus inputted, each CAM 111 recognizes an input terminal 122 that provides a lower-order bit than "0" of the input signal [ABCD] as inputting an output from a CAM 111 having a higher priority than the CAM 111 itself.

Specifically, the input signal [1110] is inputted to the CAM 111-1 at the time of reset, and has no lower-order bit than "0". Thus, in this case, the CAM 111-1 recognizes that the CAM 111-1 itself is the CAM 111 having the highest priority.

The input signal [1101] is inputted to the CAM 111-2 at the time of reset. Thus, the CAM 111-2 recognizes that the input terminal 122-2D providing a lower-order bit than "0" inputs an output from the CAM 111 (CAM 111-1) having higher priority than the CAM 111-2.

The input signal [1011] is inputted to the CAM 111-3 at the time of reset. Thus, the CAM 111-3 recognizes that the input terminals 122-3C and 122-3D providing a lower-order bit than "0" input an output from the CAMs 111 (CAMs 111-1 and 111-2) having higher priority than the CAM 111-3.

The input signal [0111] is inputted to the CAM 111-4 at the time of reset. Thus, the CAM 111-4 recognizes that the input terminals 122-4B, 122-4C, and 122-4D providing a lower-order bit than the value 0 input an output from the CAMs 111 (CAMs 111-1, 111-2, and 111-3) having higher priority than the CAM 111-4 itself.

Figures 14, 15:
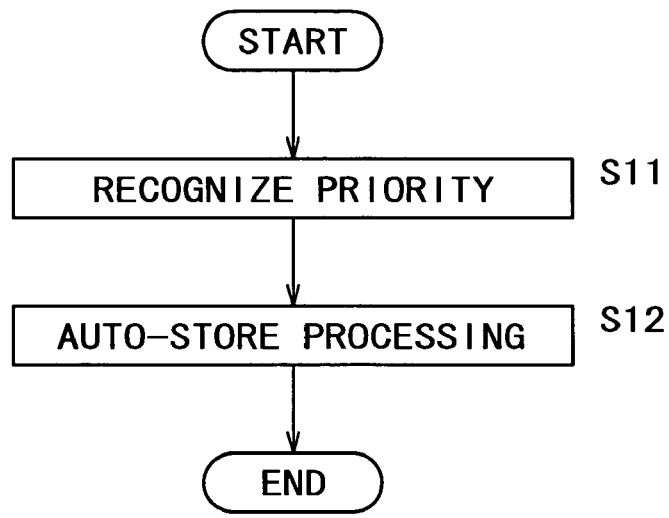
FIG. 14 is a flowchart of assistance in explaining operation of the CAM of FIG. 11.
FIG. 15 is a diagram of assistance in explaining auto-store processing of the CAMs of FIG. 11.

After each CAM 111 thus recognizes the input terminal 122 that inputs output from the CAM 111 having higher priority than the CAM 111 itself, each CAM 111 performs auto-store processing at a step S12 on the basis of a result of the recognition, as shown collectively in FIG. 15.

Specifically, when the CAM 111-1 hits as a result of searching the CAM 111-1 itself, the CAM 111-1 detects an address HHA from addresses of the hit word memories 21 and updates a time stamp in the word memory 21 of the address HHA regardless of input contents from the input terminals 122-1A to 122-1C (regardless of search results of the CAMs 111-2 to 111-4).

When an input from the input terminal 122-2D is a logical value 1 (the CAM 111-1 misses) and the CAM 111-2 itself hits, the CAM 111-2 detects an address HHA from addresses of the hit word memories 21 and updates a time stamp in the word memory 21 of the address HHA.

When an input from the input terminals 122-3C and 122-3D is a logical value 1 (the CAMs 111-2 and 111-1 miss) and the CAM 111-3 itself hits, the CAM 111-3 detects an address HHA from addresses of the hit word memories 21 and updates a time stamp in the word memory 21 of the address HHA.

When an input from the input terminals 122-4B, 122-4C, and 122-4D is a logical value 1 (the CAMs 111-3, 111-2, and 111-1 miss) and the CAM 111-4 itself hits, the CAM 111-4 detects an address HHA from addresses of the hit word memories 21 and updates a time stamp in the word memory 21 of the address HHA.

Thus, when only the CAMs 111-3 and 111-4 hit, for example, an input from the input terminal 122-4B is a logical value 0, and therefore the CAM 111-4 recognizes that the CAM 111-3 of higher priority has a hit. Even when the CAM 111-4 itself hits, the CAM 111-4 does not detect an address HHA from addresses of the hit word memories 21 and update a time stamp in the word memory 21 of the address HHA.

On the other hand, inputs from the input terminals 122-3C and 122-3D to the CAM 111-3 are a logical value 1. Therefore the CAM 111-3 recognizes that the CAMs 111-2 and 111-1 of higher priority miss, and detects an address HHA from addresses of the word memories 21 hit by the CAM 111-3 and updates a time stamp in the word memory 21 of the address HHA.

When the connected CAM 101 as a whole misses, the CAM 111 detecting an address HEA stores a source address SA and the like at the address HEA. Incidentally, whether the connected CAM 101 as a whole misses can be recognized by obtaining a logical sum of inputs from the input terminals 122A, 122B, 122C, and 122D.

Figure 10:
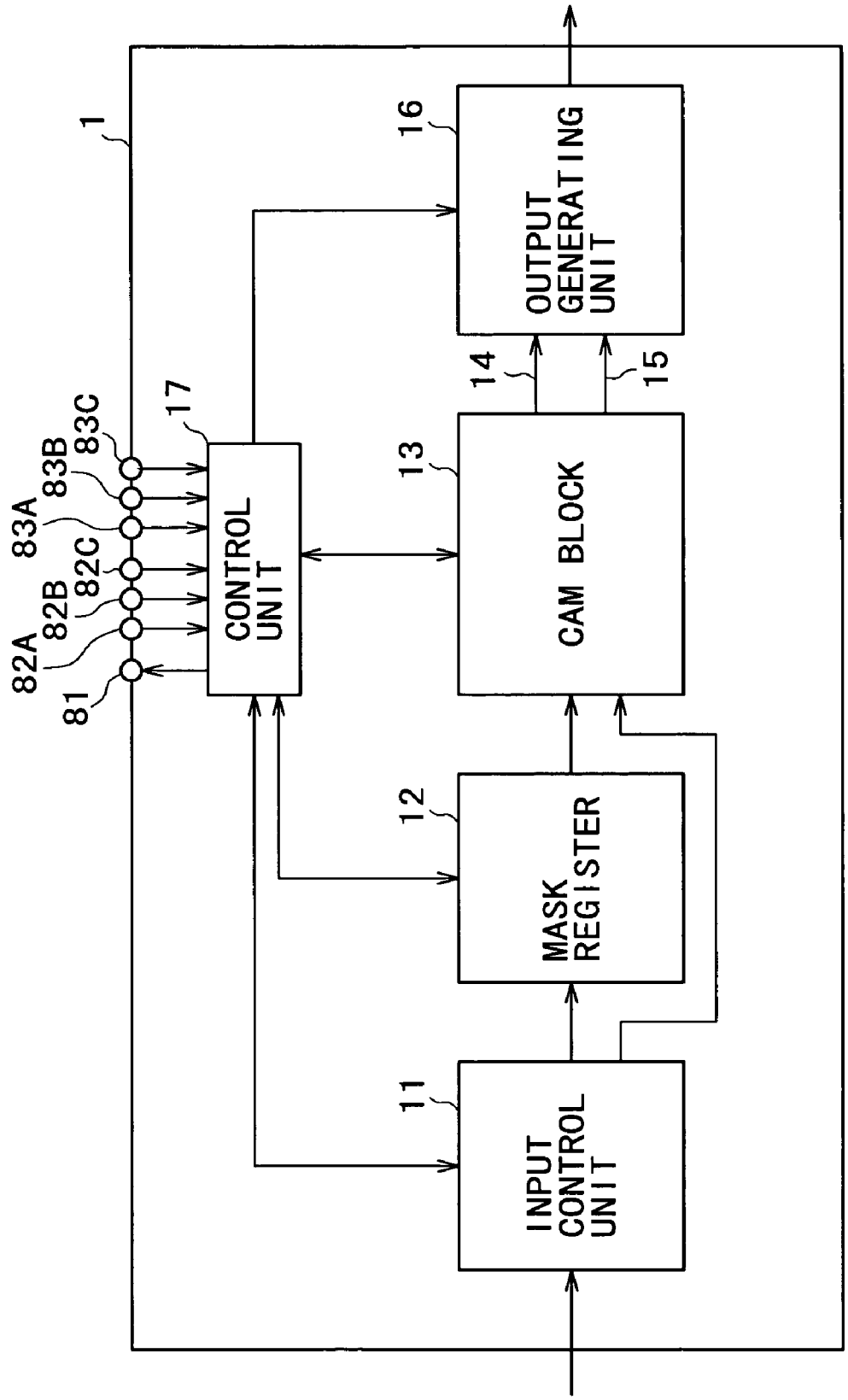
FIG. 10 is a block diagram showing an example of configuration of a CAM of FIG. 9.
Figure 16:
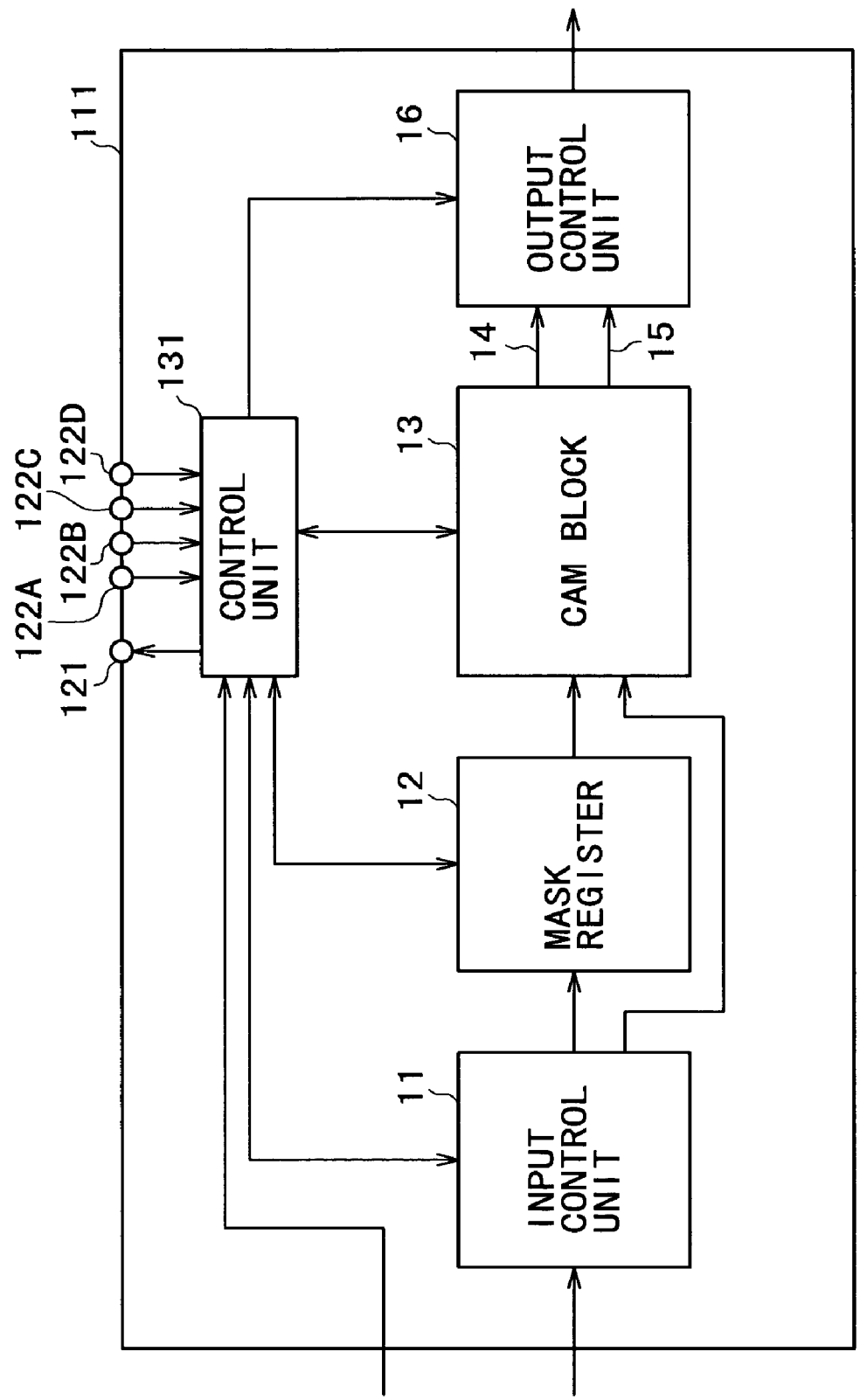
FIG. 16 is a block diagram showing an example of configuration of a CAM of FIG. 12.

FIG. 16 shows an example of configuration of a CAM 111. The CAM 111 has a control unit 131 in place of the control unit 17 shown in FIG. 10, and an output terminal 121 and input terminals 122A to 122D in place of the output terminal 81, the input terminals 82A to 82C, and the input terminals 83A to 83C. Since other parts are the same as in FIG. 10, the other parts are identified by the same reference numerals, and description of the other parts will be omitted.

Figure 17:
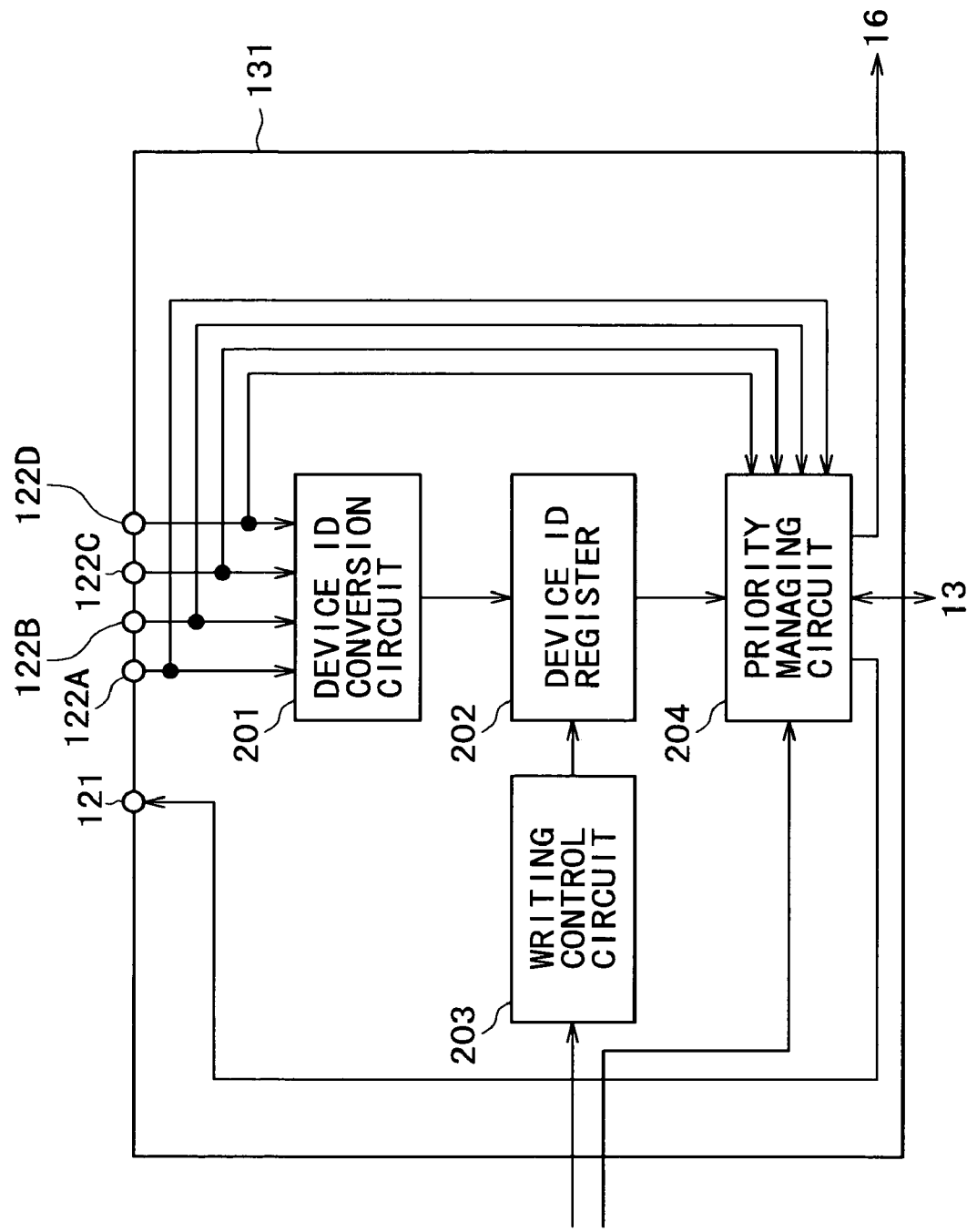
FIG. 17 is a block diagram showing an example of configuration of a control unit of FIG. 16.

FIG. 17 shows an example of configuration of the control unit 131 in FIG. 16. An input signal [ABCD] from the input terminals 122A to 122D is inputted to a device ID conversion circuit 201. The device ID conversion circuit 201 detects a device ID corresponding to the input signal [ABCD] by referring to a conversion table T as shown in FIG. 18, and then outputs the device ID to a device ID register 202.

The clock CS and the reset signal PS supplied to the control unit 131 are inputted to a writing control circuit 203. The writing control circuit 203 controls the device ID register 202 to store the device ID inputted from the device ID conversion circuit 201 in timing of a first rising edge of the clock CS after the reset signal PS is inputted and then cleared, as described with reference to FIG. 13. According to an instruction from the writing control circuit 203, the device ID register 202 stores the device ID from the device ID conversion circuit 201, and outputs the device ID to a priority managing circuit 204 as required.

The priority managing circuit 204 is supplied with the input signal [ABCD] from the input terminals 122A to 122D, the device ID from the device ID register 202, information from a CAM block 13, and the clock CS and the reset signal PS from the CPU 41.

When the reset signal PS is inputted from the CPU 41 at a time of a start of hit address retrieval, the priority managing circuit 204 outputs an initial signal FS (logical value 1) from the output terminal 121 in timing shown in FIG. 13. Incidentally, at this time, the writing control circuit 203 controls the device ID register 202 to store the device ID inputted from the device ID conversion circuit 201 at that time.

Then, the priority managing circuit 204 obtains the device ID from the device ID register 202, recognizes an input terminal 122 that inputs an output from a CAM 111 having a higher priority than the device itself from the device ID (input signal [ABCD]), and performs auto-store processing according to an input content from the input terminal 122, as described above.

It is to be noted that in the present specification, the steps describing a program provided by a recording medium include not only processing carried out in time series in the described order but also processing carried out in parallel or individually and not necessarily in time series. According to the present invention, a plurality of CAMs can be used suitably by a simple connection.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A retrieving device connected with N other retrieving devices to form a retrieving system, said retrieving device comprising:
    retrieving means for retrieving a memory part corresponding to retrieval data from memory parts possessed by the retrieving means itself;
    first output control means for controlling output of an initial signal to said other retrieving devices;
    second output control means for controlling output of a retrieval result signal indicating whether or not said memory part corresponding to said retrieval data is retrieved by said retrieving means to said other retrieving devices;
    N first input means connected to said other retrieving devices, for inputting retrieval result signals or initial signals from said other retrieving devices;
    second input means for inputting a reference signal;
    obtaining means for obtaining a priority signal in which said initial signals and said reference signal are disposed according to a predetermined priority;
    detecting means for detecting said first input means that input said initial signal of higher priority than the priority corresponding to said reference signal, on the basis of said priority signal;
    output means for detecting a predetermined memory part from said memory part retrieved by said retrieving means and outputting the predetermined memory part as a retrieval result of said retrieving system as a whole according to a content of said retrieval result signal inputted by said first input means detected by said detecting means; and
    performing means for determining that no memory part corresponding to said retrieval data is retrieved in all said other retrieving devices on the basis of said retrieval result signals inputted by said first input means, and performing predetermined processing when no memory part corresponding to said retrieval data is retrieved in all said other retrieving devices.

2. A retrieving method for a retrieving device, said retrieving device being connected with N other retrieving devices to form a retrieving system, and including: retrieving means for retrieving a memory part corresponding to retrieval data from memory parts possessed by the retrieving means itself; first output control means for controlling output of an initial signal to said other retrieving devices; second output control means for controlling output of a retrieval result signal indicating whether or not said memory part corresponding to said retrieval data is retrieved by said retrieving means to said other retrieving devices; N first input means connected to said other retrieving devices, for inputting retrieval result signals or initial signals from said other retrieving devices; and second input means for inputting a reference signal, said retrieving method comprising:
    an obtaining step for obtaining a priority signal in which said initial signals and said reference signal are disposed according to a predetermined priority;
    a detecting step for detecting said first input means that input said initial signal of higher priority than the priority corresponding to said reference signal, on the basis of said priority signal;
    an output step for detecting a predetermined memory part from said memory part retrieved by processing of said retrieving step and outputting the predetermined memory part as a retrieval result of said retrieving system as a whole according to a content of said retrieval result signal inputted by said first input means detected by processing of said detecting step; and
    a performing step for determining that no memory part corresponding to said retrieval data is retrieved in all said other retrieving devices on the basis of said retrieval result signals inputted by said first input means, and performing predetermined processing when no memory part corresponding to said retrieval data is retrieved in all said other retrieving devices.

3. A recording medium on which a computer readable program for a retrieving device is recorded, said retrieving device being connected with N other retrieving devices to form a retrieving system, and including: retrieving means for retrieving a memory part corresponding to retrieval data from memory parts possessed by the retrieving means itself; first output control means for controlling output of an initial signal to said other retrieving devices; second output control means for controlling output of a retrieval result signal indicating whether or not said memory part corresponding to said retrieval data is retrieved by said retrieving means to said other retrieving devices; N first input means connected to said other retrieving devices, for inputting retrieval result signals or initial signals from said other retrieving devices; and second input means for inputting a reference signal, said computer readable program for said retrieving device comprising:
    an obtaining step for obtaining a priority signal in which said initial signals and said reference signal are disposed according to a predetermined priority;
    a detecting step for detecting said first input means that input said initial signal of higher priority than the priority corresponding to said reference signal, on the basis of said priority signal;
    an output step for detecting a predetermined memory part from said memory part retrieved by processing of said retrieving step and outputting the predetermined memory part as a retrieval result of said retrieving system as a whole according to a content of said retrieval result signal inputted by said first input means detected by processing of said detecting step; and a performing step for determining that no memory part corresponding to said retrieval data is retrieved in all said other retrieving devices on the basis of said retrieval result signals inputted by said first input means, and performing predetermined processing when no memory part corresponding to said retrieval data is retrieved in all said other retrieving devices.

4. A program for a retrieving device, said retrieving device being connected with N other retrieving devices to form a retrieving system, and including: retrieving means for retrieving a memory part corresponding to retrieval data from memory parts possessed by the retrieving means itself; first output control means for controlling output of an initial signal to said other retrieving devices; second output control means for controlling output of a retrieval result signal indicating whether or not said memory part corresponding to said retrieval data is retrieved by said retrieving means to said other retrieving devices; N first input means connected to said other retrieving devices, for inputting retrieval result signals or initial signals from said other retrieving devices; and second input means for inputting a reference signal, said program making a computer perform processing comprising:

an obtaining step for obtaining a priority signal in which said initial signals and said reference signal are disposed according to a predetermined priority;

a detecting step for detecting said first input means that input said initial signal of higher priority than the priority corresponding to said reference signal, on the basis of said priority signal;

an output step for detecting a predetermined memory part from said memory part retrieved by processing of said retrieving step and outputting the predetermined memory part as a retrieval result of said retrieving system as a whole according to a content of said retrieval result signal inputted by said first input means detected by processing of said detecting step; and a performing step for determining that no memory part corresponding to said retrieval data is retrieved in all said other retrieving devices on the basis of said retrieval result signals inputted by said first input means, and performing predetermined processing when no memory part corresponding to said retrieval data is retrieved in all said other retrieving devices.

* * * * *